United States Patent
Senba et al.

(10) Patent No.: US 6,722,798 B2
(45) Date of Patent: Apr. 20, 2004

(54) SUBSTRATE PROCESSING APPARATUS AND SUBSTRATE PROCESSING METHOD

(75) Inventors: Norio Senba, Kikuchi-gun (JP); Akira Miyata, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/337,831

(22) Filed: Jan. 8, 2003

(65) Prior Publication Data
US 2003/0133086 A1 Jul. 17, 2003

(30) Foreign Application Priority Data
Jan. 11, 2002 (JP) .......................................... 2002-004971

(51) Int. Cl.$^7$ .......................... G03D 5/00; G03D 27/32; B05C 11/02; B65G 49/07; G03C 5/00
(52) U.S. Cl. .......................... 396/611; 355/27; 118/52; 118/712; 414/935; 430/30
(58) Field of Search ............. 355/27, 53; 396/611; 118/52, 56, 58, 708, 712; 414/935, 937, 938, 941; 430/5

(56) References Cited

U.S. PATENT DOCUMENTS

| | | | | |
|---|---|---|---|---|
| 5,766,360 A | * | 6/1998 | Sato et al. | 118/666 |
| 6,268,900 B1 | * | 7/2001 | Iwatsu | 355/27 |
| 6,281,962 B1 | * | 8/2001 | Ogata et al. | 355/27 |
| 6,402,401 B1 | * | 6/2002 | Ueda et al. | 396/611 |
| 6,593,045 B2 | * | 7/2003 | Sato et al. | 430/30 |

* cited by examiner

Primary Examiner—Alan Mathews
(74) Attorney, Agent, or Firm—Rader, Fishman & Grauer PLLC

(57) ABSTRACT

A resist coating/developing system is equipped with a cassette station, a process station and an inspection station. The inspection station comprise a defect inspection unit, a dummy inspection unit, a bypass inspection unit and a main wafer transfer device. When sampling inspections on wafer W that have completed processing in the process station, if a failure has occurred in the defect inspection unit, the inspection wafer is placed in the bypass inspection unit and excluding the inspection wafer, the non-inspection wafers are placed in the dummy inspection unit in the order that they were transferred to the inspection station and the wafer W is transferred from the inspection station to the cassette station in the order transferred from the process station to the inspection station.

14 Claims, 11 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus that coats a semiconductor wafer with a resist solution, processes it to develop a resist film after exposure to light and inspects the status of the processed wafer, and to a substrate processing method.

2. Description of the Related Art

Photolithography technology is used, for example, in the manufacturing of semiconductor devices to form determined resist patterns on a substrate such as a semiconductor wafer by coating it with a resist solution and by exposing the resist film to light using photo mask and further subjecting it to developing processing. Conventionally, a resist coating/developing system has been used in such series of processes.

The resist coating/developing system is equipped with various kinds of processing unit for the series of processes necessary in coating resist and developing processing. For example, equipped are the resist coating unit for coating the wafer with the resist solution, the developing unit for developing the light-exposed wafer and a heating unit for heating the wafer after the resist coating and developing processing.

Also, linked to the resist coating/developing system is a inspecting/measuring unit for inspecting and/or measuring the status of the processed wafer after developing processing. The inspecting/measuring unit inspects and/or measures the resist pattern line width and the layering of the resist patterns and base patterns, unevenness of the resist coating and developing defects.

However, in a system that link conventional inspecting/measuring unit to the resist coating/developing system, when the inspecting/measuring unit should experience a system failure and the inspecting/measuring of wafer is no longer possible, processing in the resist coating/developing system will be cancelled thereby causing many defective wafers to be produced.

Also, if the inspecting/measuring unit is linked to the resist coating/developing system, they distort the shape of the entire system because they protrude from the resist coating/developing system. Therefore, when installing the entire system into a clean room, it is necessary for the installation area to be wider than the inspecting/measuring unit.

Furthermore, because generally the throughput of the resist coating/developing system and the inspecting/measuring unit are different and wafers are handed over between the resist coating/developing system and the inspecting/measuring units using a wafer transfer device established on the resist coating/developing system, a wafer transfer rate in the resist coating/developing system decrease which causes the problem of decreased throughput of the entire system.

BRIEF SUMMARY OF THE INVENTION

An object of the present invention is to provide a substrate processing apparatus and substrate processing method that can prevent the generation of defective substrates in the event circumstances disallow substrates for inspecting/measuring to be transferred into a device that inspects/measures substrates. Still another object of the present invention is to provide a substrate processing apparatus that can efficiently transfer substrates and that has a compact footprint.

According to a first aspect of the present invention, there is provided a substrate processing apparatus that performs predetermined process on a series of substrates one by one comprising

- a cassette station that holds cassettes storing a plurality of substrates;
- a process station for performing predetermined process on a substrate transported out from said cassettes;
- an inspection station for performing predetermined inspection and/or measurement on a substrate that have completed said process at said process station;
- a substrate transfer means for transferring a substrate between said cassette station, said process station and said inspection station; and
- a transfer control mechanism for controlling the operations of said substrate transfer means;
- wherein said inspection station comprises:
   - an inspecting/measuring unit for performing the inspection and/or measurement on a substrate transferred from said process station to said inspection station; and
   - an emergency stage unit into which a inspection/measurement substrate for the inspection and/or measurement using said inspecting/measuring unit is temporarily transferred, said emergency stage unit being established in parallel to said inspecting/measuring unit;
   - and wherein said transfer control mechanism controls said substrate transfer means to transfer said inspection/measurement substrate from said process station to said cassette station via said substrate stage when circumstances disallow transferring substrates into said inspecting/measuring unit.

In such a substrate processing apparatus, when circumstances disallow the transferring of the substrate into the inspecting/measuring unit for inspecting/measuring, the inspection/measurement substrate is temporarily transferred to the emergency stage unit, then transferred from there to the aforementioned cassette station to continue substrate processing in the substrate processing apparatus. This prevents the generation of defective substrates.

According to a second aspect of the present invention, there is provided a substrate processing apparatus that performs predetermined process on a series of substrates on by one comprising:

- a cassette station having a cassette stage for holding a cassette that stores a plurality of substrates and a substrate transfer I/O device for transferring a substrate into and out of said cassette placed on said cassette stage;
- a process station for performing predetermined process on a substrate transferred out from said cassette;
- an inspection station having an inspecting/measuring unit for performing predetermined inspection and/or measurement on a substrate that have completed process at said process station, said inspection station being established between said cassette station and said process station; and
- a selecting means for selecting inspection/measurement substrates for the inspection and/or measurement using said inspecting/measuring unit from substrates transferred into said inspection station;

wherein said process station comprises:

a process portion in which the predetermined process is performed on a substrate;

a substrate transfer device for transferring a substrate into and out of said process portion and transfers each substrate having been processed at said process portion to said inspection station in the same order as transferred from said cassette;

and wherein said inspection station further comprises:

a temporary stage unit that temporarily holds non-inspection substrates other than said inspection/measurement substrates; and a substrate transfer means for transferring a substrate according to the order transferred from said cassette, from said cassette station to said process station and transferring a substrate from said inspection station to said cassette station according to the order transferred into said inspection station, and transferring a substrate into and out of said inspecting/measuring unit and said temporary stage unit.

By establishing the inspection station in this way between the cassette station and the process station, the footprint of the apparatus can be made more compact and can enable the efficient transferring of substrates. If an emergency stage unit for transferring a inspection/measurement substrate is established into the inspection station for when circumstances arise that disallow the transferring of the substrate into the inspecting/measuring unit, and with a structure that enables the substrate transfer means to access this emergency stage unit, the inspection/measurement substrate can be transferred into the cassette station via this emergency stage unit when circumstances arise disallow the transferring of the substrate into the inspecting/measuring unit. This enables the processing of substrates in the substrate processing apparatus to continue and prevents the generation of useless substrates.

According to a third aspect of the present invention, there is provided a substrate processing method, comprising steps of:

transferring a substrate from a cassette that stores a plurality of substrates to a process station for performing predetermined process on a substrate;

processing substrates one by one in said process station that are transferred into said process station;

transferring each substrate that have completed the process in said process station from said process station to an inspection station for performing inspecting/measuring a state of processed substrate, said inspection station having an inspecting/measuring unit for performing predetermined inspection and/or measurement on a substrate;

selecting inspection/measurement substrates for the inspection and/or measurement using said inspecting/measuring unit from substrates transferred to said inspection station;

temporarily transferring said inspection/measurement substrates to a emergency stage unit that established in parallel with said inspecting and/or measuring unit when circumstances arise that disallow transferring of said inspection/measurement substrates into said inspecting/measuring unit; and transferring each substrate transferred into said emergency stage unit to said cassette station.

According to a fourth aspect of the present invention, there is provided a substrate processing method comprising steps of:

transferring substrates one by one to from a cassette that stores a plurality of substrates to a process station for performing predetermined process on substrates according to the order that substrates are arranged in said cassette;

processing substrates one by one in said process station that are transferred into said process station;

transferring each substrate that have completed process in said process station from said process station to an inspection station for performing inspecting/measuring a state of processed substrate in the same order as the substrates were transferred from said cassette, said inspection station having a inspecting/measuring unit for performing predetermined inspection and/or measurement on a substrate;

selecting inspection/measurement substrates for the inspection and/or measurement using said inspecting/measuring unit from substrates transferred to said inspection station;

temporarily transferring said inspection/measurement substrates to an emergency stage unit that holds a substrate and established in parallel with said inspecting/measuring unit when circumstances arise that disallow transferring of said inspection/measurement substrates into said inspecting/measuring unit, in case where each of said inspection/measurement substrates is transferred to said inspecting/measuring unit, transferring non-inspection substrates other than said inspection/measurement substrates to a temporary stage unit that holds a substrate and established in parallel with said inspecting/measuring unit, in the order of transfer to said inspection station; and transferring each substrate from said inspecting/measuring unit, said emergency stage unit and said temporary stage unit to said cassette station in the order of transfer to said inspection station.

In such substrate processing methods, when circumstances disallow the transferring of substrates into the inspecting/measuring unit for inspection/measurement, the inspecting/measuring of the inspection/measurement substrates cannot be performed, but the processing of substrates in the substrate processing apparatus can continue, by transferring the inspection/measurement substrate to the emergency stage unit. This prevents the generation of process-defective substrates.

According to a fifth aspect of the present invention, there is provided a substrate processing method comprising steps of:

transferring substrates one by one from a cassette that stores a plurality of substrates to a process station for performing predetermined process on substrates according to the order that substrates are arranged in said cassette;

processing substrates one by one in said process station that are transferred into said process station;

transferring each substrate that have completed process in said process station from said process station to an inspection station for performing inspecting/measuring a state of processed substrate in the same order as the substrates were transferred from said cassette, said inspection station having a inspecting/measuring unit for performing predetermined inspection and/or measurement on a substrate;

selecting inspection/measurement substrates for the inspection and/or measurement using said inspecting/ measuring unit from substrates transferred to said inspection station;

temporarily transferring said inspection/measurement substrates to said inspecting/measuring unit when circumstances arise that disallow the inspection and/or measurement of said inspection/measurement substrates using said inspecting/measuring unit, but transferring of said inspection/measurement substrates into said inspecting/measuring unit is permitted, in case where each of said inspection/measurement substrates is transferred to said inspecting/measuring unit;

transferring said non-inspection substrates to a temporary stage unit that holds a substrate and established in parallel with said inspecting and/or measuring unit, in the order of transfer to said inspection station;

transferring non-inspection substrates other than said inspection/measurement substrates to a temporary stage unit that holds a substrate and established in parallel with said inspecting/measuring unit, in the order of transfer to said inspection station; and transferring each substrate from said inspecting/measuring unit and said temporary stage unit to said cassette station in the order of transfer to said inspection station.

With this substrate processing method, when circumstances arise that disallow the inspecting/measuring of substrate using the inspecting/measuring unit, such as a failure, but it is possible to place substrates in the inspecting/measuring unit, the inspecting/measuring of the inspection/measurement substrates is not performed, but the processing of substrates in the substrate processing apparatus can continue, by using the inspecting/measuring unit as a unit to temporarily hold substrates. This prevents the generation of process-defective substrates.

BRIEF DESCRIPTION OF THE DRAWINGS

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

The following shall describe the embodiment of the present invention in reference to the drawings provided. This describes the present invention as it applies a resist coating/developing system for performing a series of processes for coating a semiconductor wafer with resist solution, developing a light-exposed resist film and performing inspections on the states of processed wafer.

Figure 1:
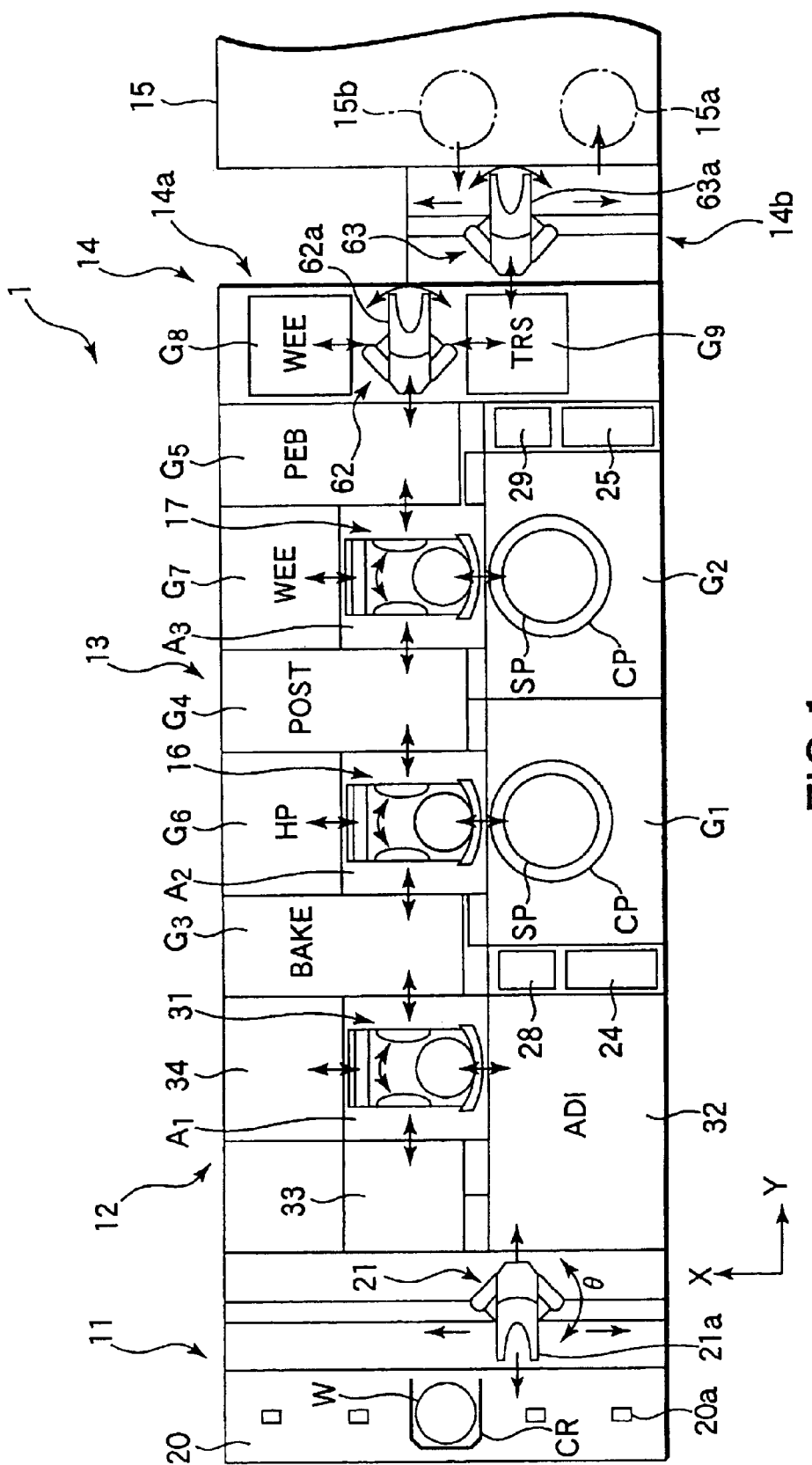
FIG. 1 is a plan view schematically showing the resist coating/developing system according to the present invention.
Figure 2:
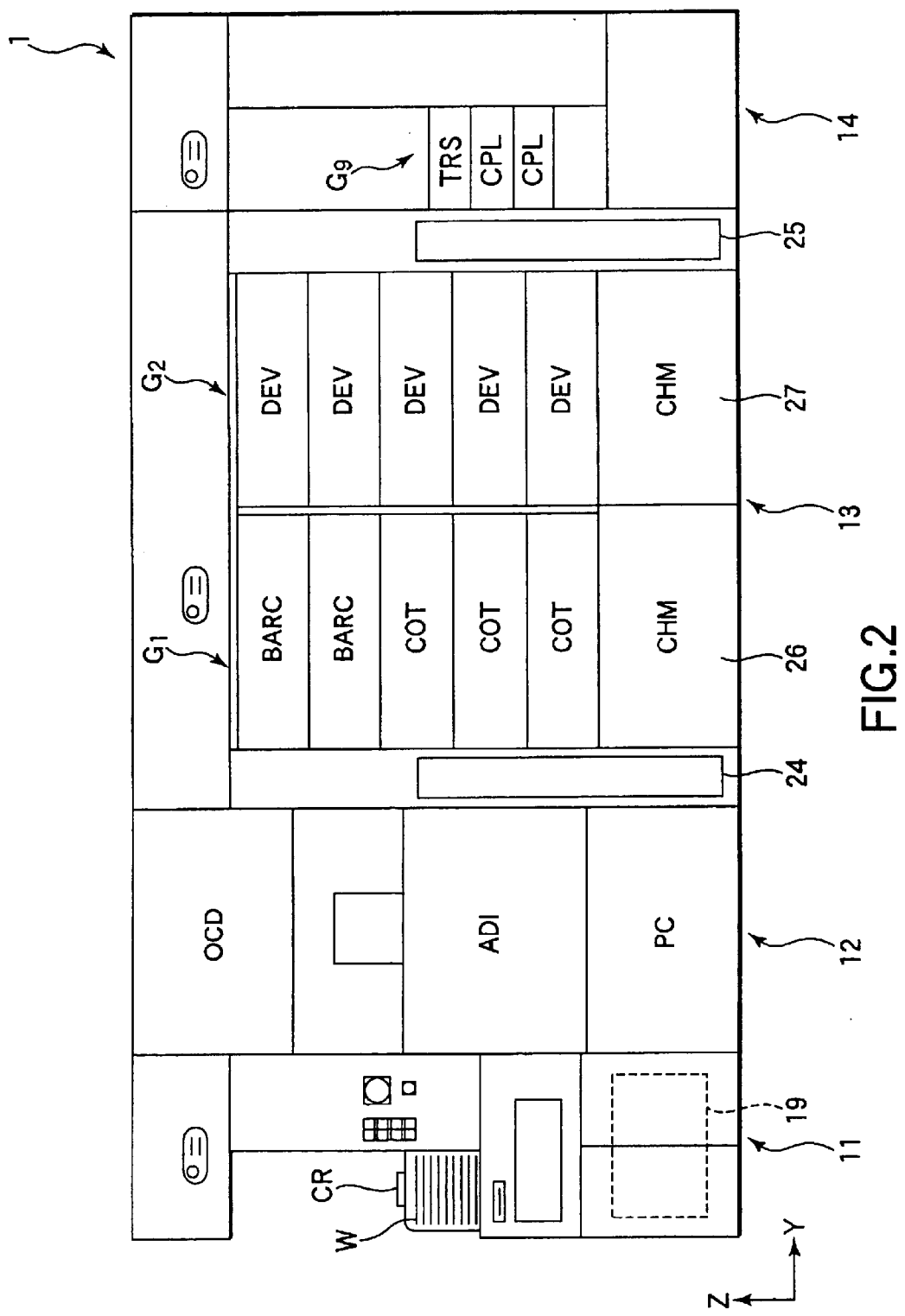
FIG. 2 is a front view schematically showing the resist coating/developing system shown in FIG. 1.
Figure 3:
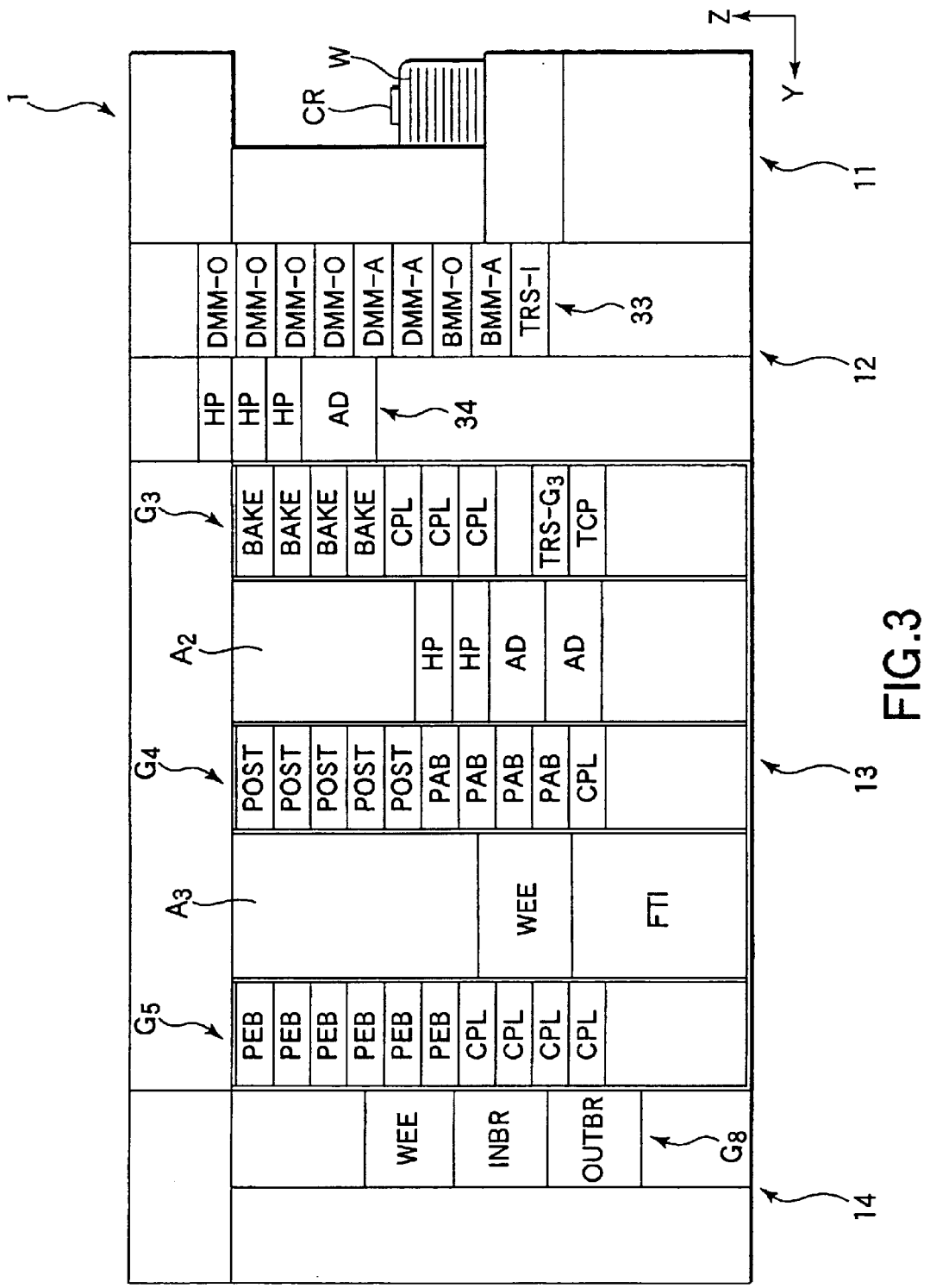
FIG. 3 is a back view schematically showing the resist coating/developing system shown in FIG. 1.

FIG. 1 is a plan view schematically showing the resist coating/developing system 1; FIG. 2 is a front view schematically showing the same; FIG. 3 is a back view schematically showing the same.

The resist coating/developing system 1 is equipped with a cassette station 11 which is a transfer station, a process station 13 having a plurality of process units, an inspection station 12 which transfers the wafer W between the cassette station 11 and the process station 13 and that inspects the wafer W that has been processed at the process station 13 and an interface portion 14 that hands over the wafer W to a light exposure device 15, established adjacent to the process station 13.

In the resist coating/developing system 1, because the inspection station 12 is arranged between the cassette station 11 and the treatment station 13, it does not distort the shape of the resist coating/developing system 1 and thus, the footprint required in the cleanroom for the resist coating/developing system 1 is smaller. Also, as described below, it is possible to efficiently transfer the wafers W by applying a portion of the wafer transfer system in the resist coating/developing treatment system 1 to the inspection station 12. This improves throughput.

The cassette station 11 comprises a cassette stage 20 that stacks the wafer cassette (CR) wherein a plurality of the wafers W to be processed are stored, for example, in groups of 25 wafers. The wafer cassette (CR) is transferred from another system to the cassette stage 20 and conversely, from the cassette stage 20 to a different processing system. As shown in FIG. 1, on the cassette stage 20 are formed a plurality of positioning protrusions 20a (five are shown in the drawing) in the X direction. The wafer cassette (CR) is placed on the protrusion 20a position in a single line with the wafer I/O opening of the wafer cassette (CR) facing the inspection station 12. Note that in the wafer cassette (CR), the wafers W are arranged substantially parallel in the vertical direction (Z direction).

The cassette station 11 comprises a wafer transfer mechanism 21 that is positioned between the cassette stage 20 and the inspection station 12, and that performs the transfer of the wafer W between the wafer cassette (CR) placed on the cassette stage 20 and the process station 13. The wafer transfer mechanism 21 comprises a wafer transfer pick 21a movable in the cassette arrangement direction (X direction) and in the wafer W arrangement direction (Z direction) in the wafer cassette (CR), the wafer transfer pick 21a capable of selectively accessing any of the wafer cassettes (CR). Also, the wafer transfer pick 21a is swingable in the θ direction, as shown in FIG. 1, and can access a transit unit (TRS) (hereinafter called the transit unit (TRS-I)) which belongs to a wafer stage module 33 in the inspection station 12 described below.

The inspection station 12 comprises a inspection module 32 for inspecting the status of processed wafers W when the resist coating/developing system 1 is used normally, the wafer stage module 33 where the wafers W are temporarily placed, the heat treatment module 34 for heating the wafers W and a first main transfer portion A1.

To the inspection module 32 are established a line width measuring unit (OCD) for measuring the width of developed lines, a defect inspection unit (ADI) for inspecting for scratches on the surface of the resist coating (scratch detection), dust particle (comet detection) contaminated when coating the resist solution, uneven development and developing defects after the developing processing, and a computer (PC) to control the line width measuring unit (OCD) and defect inspection unit (ADI) and to analyze information obtained in each inspection unit.

In the inspection/measurement in the defect inspection unit (ADI) and the line width measuring unit (OCD), for example, the surface of the wafer W is monitored by a CCD camera and those images are analyzed by the computer (PC).

As for the structure of the defect inspection unit (ADI) and the line width measuring unit (OCD), a stage for holding the wafer W and a CCD camera are established in the frame. The following combinations can be considered: (1) the stage is rotatable and the CCD camera is movable in the X, Y and Z directions; (2) the stage is fixed and the camera is movable in the X, Y and Z directions and rotatable within the X–Y plane; and (3) the stage is movable in the X, Y and Z directions and rotatable within the X–Y plane and the CCD camera is fixed.

Measurements using the line width measuring unit (OCD), for example, can be performed on all of the wafers W or on every 2 to 14 wafers. Also, inspections using the defect inspection unit (ADI) can be performed on all of the wafers W or on one of every two wafers.

The wafers W for measurements using the line width measuring unit (OCD) are hereinafter called measurement wafers W while wafers W other than the measurement wafers W are hereinafter called non-measurement wafers W. Similarly, the wafers W for inspections using the defect inspection unit (ADI) are hereinafter called inspection wafers W while wafers W other than the inspection wafers W are hereinafter called non-inspection wafers W.

Selecting of the measurement wafers W and the inspection wafers W are performed by a central control portion 19 described hereinafter.

To each of the defect inspection unit (ADI) and line width measuring unit (OCD) are established warning devices (not shown in the drawings) that issue warnings when circumstances, such as a failure or trouble, that disallow inspections or measurements on the wafer W and warning cancellation devices (not shown in the drawings) that an operator can select when operating to cancel the warning, whether or not to cancel or to continue the processing of all of the wafers W in the whole of the resist coating/developing system 1. It is acceptable to apply a function in the warning cancellation devices that automatically switches the wafer W transfer flow (hereinafter referred to as 'transfer flow') in the inspection station 12 to transfer flows pre-selected by the operator when trouble occurs in the defect inspection unit (ADI) or the line width measuring unit (OCD).

The wafer stage module 33 is mounted with a plurality of stages of a transit unit (TRS-I), a dummy measurement unit (DMM-O), a dummy inspection unit (DMM-A), a bypass measurement unit (BMM-O) and the bypass inspection unit (BMM-A). The transit unit (TRS-I) holds the wafer W when it is transferred in from the cassette station 11 and conversely, when transferring the wafer W out to the cassette station 11.

Here, for example, if the throughput of the inspection station 12 is lower than that of the other stations, the overall throughput of the resist coating/developing treatment system 1 will be lowered depending on the throughput of the inspection station 12. Therefore, so that such a lowering of throughput does not occur, a processing method to periodically withdraw one wafer W from a plurality of wafers W as the measurement/inspection wafer W and to perform inspection/measurement using the line width measuring unit (OCD) and the defect inspection unit (ADI) is employed in the inspection station 12.

The dummy measurement unit (DMM-O) is used to temporarily hold the non-measurement wafer while the measurement wafer W is being measured in the line width measuring unit (OCD). In a sense, the dummy measurement unit (DMM-O) becomes a temporary stage unit wherein line width measurements of the wafer W are not performed. For this reason, for example, the dummy measurement unit (DMM-O) has a stage inside a case and comprises a structure that equips more than three support pins to support the wafer W on this stage. In the same way, the dummy inspection unit (DMM-A) is used to temporarily hold the non-inspection wafer W while the inspection wafer W is being inspected in the defect inspection unit (ADI). In the dummy inspection unit (DMM-A), as well, defect inspections on the wafer W are not performed.

Note that in FIG. 3 are shown the two-stage dummy inspection unit (DMM-A) and the four-stage dummy measurement unit (DMM-O) mounted onto the wafer stage module 33. The dummy inspection unit (DMM-A) and the dummy measurement unit (DMM-O) are mounted in a number of units that are suitable and appropriate in consideration of throughput when performing determined inspections/measurements in the inspection station 12.

In the event that trouble, such as a failure, occurs in the line width measuring unit (OCD) or the defect inspection unit (ADI) established in the inspection module 32, it is necessary to either stop processes on the wafers W in the resist coating/developing system 1 or to continue processes on the wafer W.

In the former case, the operator would select to stop processes of the resist coating/developing system 1 when canceling the warning issued from the line width measuring unit (OCD) or the defect inspection unit (ADI) on which there was a failure.

On the other hand, in the latter case, because the measurement wafer W and the inspection wafer W cannot be transferred into the line width measuring unit (OCD) or the defect inspection unit (ADI), the measurement W and the inspection wafer W must be retracted to locations different from the dummy measurement unit (DMM-O) and dummy inspection unit (DMM-A).

The bypass measurement unit (BMM-O) is an emergency stage unit used to temporarily transfer the measurement wafer W when circumstances arise that disallow the transferring of the wafer W into the line width measuring unit (OCD). To express this differently, the bypass measurement unit (BMM-O) is not used if trouble has not occurred in the line width measuring unit (OCD). Also, line width measurements on developed lines are not performed in the dummy measurement unit (DMM-O). The bypass measurement unit (BMM-O) comprises the same structure as the dummy measurement unit (DMM-O).

The bypass inspection unit (BMM-A) is an emergency stage unit used to temporarily transfer the inspection wafer W when circumstances arise that disallow the transferring of the wafer W into the defect inspection unit (ADI). In the bypass inspection unit (BMM-A) as well, inspections of the wafer W are not performed. The bypass inspection unit (BMM-A) comprises the same structure as the dummy inspection unit (DMM-A).

It is also possible to establish in the heat treatment units 34, for example, an adhesion unit (AD) to apply a hydrophobic treatment to the wafer W or a post-bake unit (POST) to heat treatment the wafer W after developing processing are completed. Also, it is possible to further equip the heat treatment units 34 with the dummy measurement unit (DMM-O) and the dummy inspection unit (DMM-A) or the bypass measurement unit (BMM-O) and the bypass inspection unit (BMM-A).

Equipped on the first main transfer portion A1 is the first main wafer transfer device 31 that can access each of the units belonging to the inspection module 32, the wafer stage module 33, and the heat treatment module 34, and can access the third process unit group G3 in the process station 13 which is described below. The structure of the first main wafer transfer device 31 comprises the same structure as the second main wafer transfer device 16 which is described below. The structure of the second main wafer transfer device 16 is described later.

At the process station 13, on the system back side (the top portion of FIG. 1) are arranged in order from the inspection station 12, the third process unit group G3, the fourth process unit group G4 and the fifth process unit group G5, the second main wafer transfer portion A2 is equipped between the third process unit group G3 and the fourth process unit group G4 and the third main wafer transfer portion A3 is equipped between the fourth process unit group G4 and the fifth process unit group G5. Also, the first process unit group G1 and the second process unit group G2 are established to the system front side (lower portion of FIG. 1) in order from the inspection station 12.

As shown in FIG. 3, in the third process unit group G3, ten-stages, for example, of an oven type treatment unit for performing predetermined treatments on a wafer W placed on a stage, for example a high temperature treatment unit (BAKE) for performing a predetermined heat treatment on the wafer W, a high precision temperature control unit (CPL) for performing heat treatment on the wafer W under a high precision temperature control, a temperature control unit (TCP) and a transit unit (TRS) (hereinafter called the transit unit (TRS-G3)) that hands over the wafer W between the first transfer portion A1 and the second transfer portion A2. Note that a space is established in the third stage from the bottom on the third process unit group G3 so that a desired oven type treatment unit can be mounted.

On the fourth process unit group G4, a total ten-stages, for example, of a pre-bake unit (PAB) for performing preheat treatment on the wafer W after coating resist solution, a post-bake unit (POST) and a high precision temperature control unit (CPL) are stacked. On the fifth process unit group G5, a total ten-stages, for example, of a post-exposure bake unit (PEB) for performing heat treatment on the wafer W after light exposure and before development and a high precision temperature control unit (CPL) are stacked.

As shown in FIG. 1 and FIG. 3, on the back side of the second main transfer portion A2 are established a sixth process unit group G6 that comprises an adhesion unit (AD) and a heating unit (HP) for heating the wafers W. Note that a mechanism to control the temperature of the wafer W is provided to the adhesion unit (AD). Also, to the back of the third main transfer portion A3 are the peripheral light exposure device (WEE) that selectively exposes light to only the edges of the wafer W and a seventh process unit group G7 that comprises a film thickness measuring device (FTI) for measuring the thickness of the resist film coating. Here it is also acceptable to arrange the peripheral light exposure device (WEE) in a plurality of stages. Also, to the back side of the third main transfer portion A3 is arranged a heat treatment unit that is equivalent to the heating unit (HP) in the same way as the back side of the second main transfer portion A2.

As shown in FIG. 1 and FIG. 2, with the first process unit group G1, a total of five-stages of the spinner type process units, for example, a resist coating units (COT) and a bottom coating units (BARC), which form an antireflection film to prevent reflection of light when exposing to light, are vertically superposed. In these spinner type process units, the wafer W is placed on the spin chuck SP within the cup (CP) and processed. Also, in the second process unit group G2, five spinner type process units, for example, five developing units (DEV) are vertically superposed.

To the second main transfer portion A2 is established a second main wafer transfer device 16, the second main wafer transfer device 16 able to selectively access each of the units equipped on the first process unit group G1, the third process unit group G3, the fourth process unit group G4 and the sixth process unit group G6. Also, to the third main transfer portion A3 is established a third main wafer transfer device 17, the third main wafer transfer device 17 able to selectively access each of the units equipped on the second process unit group G2, the fourth process unit group G4, the fifth process unit group G5 and the seventh process unit group G7.

Figure 4:
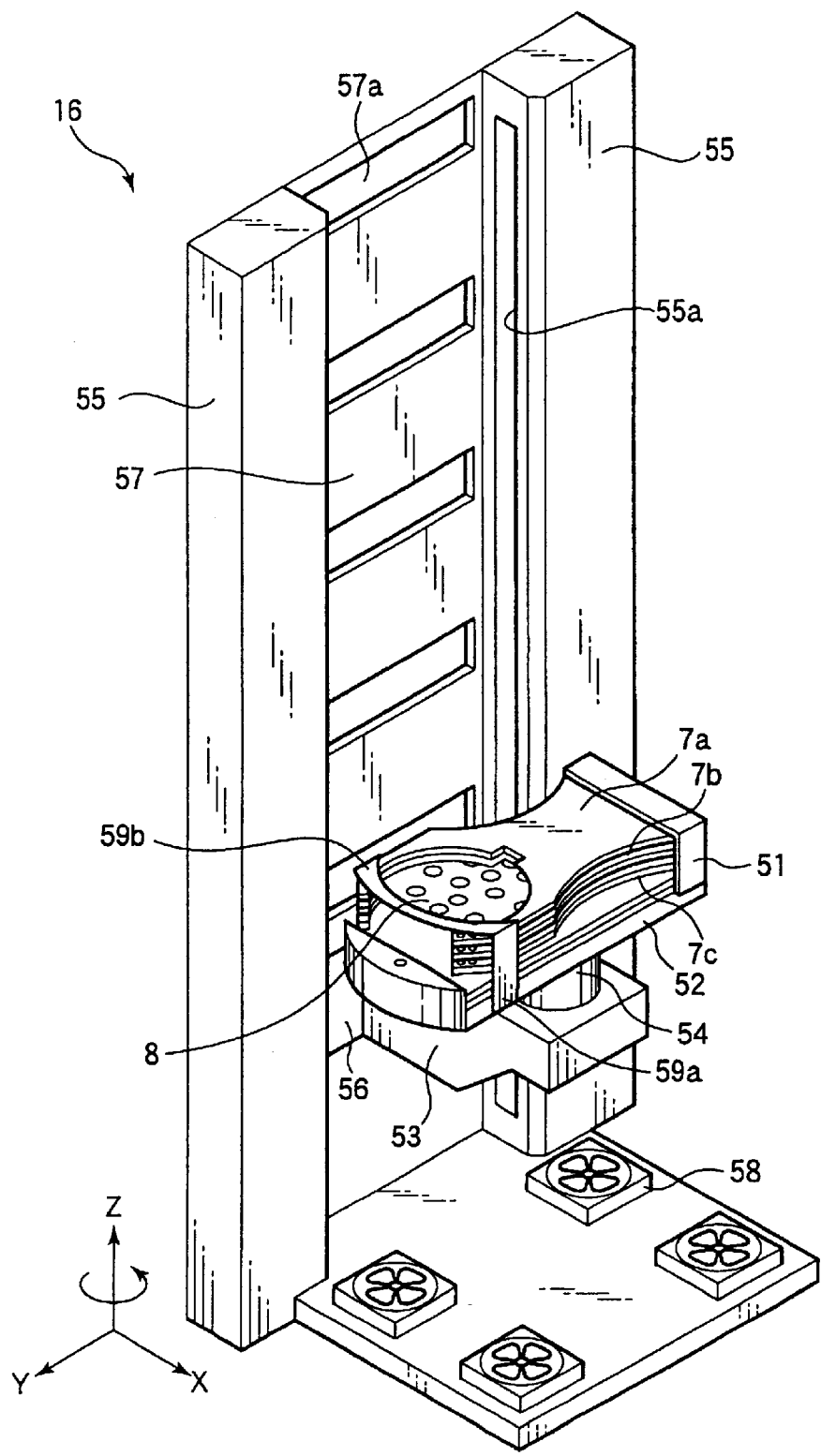
FIG. 4 is a perspective view showing the schematic structure of the main wafer transfer device.

FIG. 4 is a perspective view showing the schematic structure of the second main wafer transfer device 16. The second main water transfer device 16 comprises three arms 7a (upper), 7b (middle) and 7c (lower) that support the wafer W, arm support plates 51 (the drawing showing it being mounted to only the arm 7a) that is mounted to the base of each of the arms 7a to 7c, the base 52 which abuts each of the arm support plates 51, a support portion 53 that supports the base 52, a motor (not shown in the drawings) which is built-in the support portion 53, a rotating rod 54 that interlocks a base 52 and the motor, support shafts 55 established on each side of the first process unit group G1 and second process unit group G2 sides formed therein with sleeves 55a in the perpendicular direction, a flange member 56 that slidingly engages the sleeves 55a and is interlocked with the support portion 53 and an elevator mechanism, not shown in the drawings, which raises and lowers the flange member 56.

On the base 52, is laid a rail, not shown in the drawings, for each of the arm support plates 51, parallel to the length directions, the arm support plates 51 slide freely along the rails. Also, by rotating the support portion 53 by the built-in motor, the rotating rod 54 rotates thereby rotating the base 52 within the X–Y plane. Further, because the support portion 53 is mounted to the flange member 56 that is movable in the Z direction, the base 52 also moves in the Z direction.

Because of this structure, the arms 7a to 7b on the second main wafer transfer device 16 move in the X, Y and Z directions and can access each unit of the aforementioned first process unit group G1, the third process unit group G3, the fourth process unit group G4 and the sixth process unit group G6.

To both sides on the tip portion of the base 52 are mounted vertical members 59a, thereto is mounted between the arm 7a and the arm 7b a cover plate 8 that obstructs radiation heat coming from both arms, and a bridge member 59b is mounted between these vertical members 59a. In the center of the bridge member 59b and the end of the base 52 are disposed paired optical sensors (not shown in the drawings) therewith, the presence of the wafers W on each of the arms 7a to 7c and protrusions of wafers W can be confirmed. The third main wafer transfer device 17 and the first main wafer transfer device 31 comprise the same structure as the second main wafer transfer device 16.

Note that a wall portion 57 shown in FIG. 4 is a part of the housing of the second main transfer portion A2 on the side of the first process unit group G1 and a window 57a established in the wall 57 is for handing over the wafer W between each unit disposed in the first process unit group G1. Also, four fans 58 disposed in the base of the second main transfer portion A2 control the air pressure, the temperature and the humidity in the housing.

Between the first process unit group G1 and the inspection station 12 and between the second process unit group G2 and the interface portion 14 are disposed solution temperature control pumps 24 and 25 that supply processing solution to the first process unit group G1 and to the second process unit group G2, and ducts 28 and 29 that supply clean air to the inside of each process unit group of G1 to G5 from an air conditioning unit, not shown in the drawings, disposed on the resist coating/developing system 1.

The first process unit group G1 to the seventh process unit group G7 are removable for maintenance purposes, and the back panel on the process station 13 can also be removed or opened and closed. Also, on the lowermost stage of each of the first process unit group G1 and the second process unit group G2 are disposed chemical units (CHM) 26 and 27 that supply a predetermined process solution to the first process unit group G1 and the second process unit group G2. Note that below the cassette station 11 is disposed the central control portion 19 for controlling the entire system of the resist coating/developing system 1.

The interface portion 14 is composed of the first interface portion 14a on the process station 13 and the second interface portion 14b on the light exposure device 15. To the first interface portion 14a is arranged a first wafer transfer 62 to oppose the aperture of the fifth process unit group G5. To the second interface portion 14b is arranged a second wafer transfer 63 which is movable in the X direction.

To the backside of the first wafer transfer 62 arranged to oppose thereto is a eighth process unit group G8 being equipped in a plurality of stages with a peripheral light exposure device (WEE), an in-buffer cassette (INBR) that temporarily stores the wafer W being transferred to the light exposure device 15, and an out-buffer cassette (OUTBR) that temporarily stores the wafer W being transferred from the light exposure device 15. The in-buffer cassette (INBR) and the out-buffer cassette (OUTBR), for example, store 25 wafers W. Also, to the front side of the first wafer transfer 62, arranged to oppose thereto is a process unit group G9 disposed in a plurality of stages in order from the top with a transit unit (TRS) and two high precision temperature control units (CPL).

The first wafer transfer 62 moves in the Z direction and can rotate in the θ direction and comprises a fork 62a extendable in the X–Y plane for wafer handover. The fork 62a can access each of the units of the fifth process unit group G5, the eighth process unit group G8 and the ninth process unit group G9 to transfer the wafer W between each of these units.

The second wafer transfer 63 moves in the Y and Z directions and can rotate in the θ direction and comprises a fork 63a that is extendable in the X–Y plane for handover. This fork 63a can access each unit of the ninth process unit group G9, a in-stage 15a and a out-stage 15b on the light exposure device 15 to transfer the wafer W between these portions.

In the resist coating/developing system 1 described above, the wafer transfer mechanism 21 draws out the wafer W from the wafer cassette (CR) that stores the unprocessed wafer W according to the arrangement therein, and transfers it to the transit unit (TRS-I). Subsequently, the wafer W is transferred by the first main wafer transfer device 31 to the transit unit (TRS-G3) and is further transferred, for example, into the temperature control unit (TCP) by the second main wafer transfer device 16 to undergo a determined temperature control treatment. Note that it is also acceptable for the wafer W to be transferred directly from the wafer stage module 33 to the temperature control unit (TCP).

After the treatment is completed in the temperature control unit (TCP), the wafer W is transferred to the bottom coating unit (BARC) which belongs to the first process unit group G1, where an anti-reflective coating is formed upon the wafer W. Subsequent to that, the wafer W is transferred to the heating unit (HP) therein to undergo the predetermined heating treatment. Continuing, the wafer W is transferred to the high temperature heat treatment unit (BAKE) therein the wafer W undergoes a heat treatment that is a higher temperature than the process temperature in the heating unit (HP).

Note that before forming the anti-reflective coating on the wafer W using the bottom coating unit (BARC), it is also acceptable to transfer the wafer W to the adhesion unit (AD) to perform adhesion therein. Also, if the forming of the anti-reflective coating is not performed on the wafer W using the bottom coating unit (BARC), it is also acceptable to transfer the wafer W, for example, to the adhesion unit (AD) to perform adhesion there and subsequently transfer the wafer W to the high precision temperature control unit (CPL) which belongs to the fourth process unit group G4 and then transfer it to the resist coating unit (COT).

Next, the wafer W is transferred by the second wafer transfer device 16 from the high temperature heat treatment unit (BAKE) to the high precision temperature control unit (CPL) which belongs to the fourth process unit group G4 where the predetermined temperature treatment is performed. The wafer W, having completed the temperature treatment, is transferred to the resist coating unit (COT) which belongs to the first process unit group G1 where resist solution is coated thereto. The wafer W, having been coated with resist solution, is transferred to the pre-bake unit (PAB) which belongs to the fourth process unit group G4 where the predetermined heat treatment is performed. Residual solvent from the coating film on the wafer W is evaporated in the pre-bake unit (PAB).

The wafer W having completed the treatment in the pre-bake unit (PAB) is transferred to the film thickness measuring device (FTI) which is disposed on the seventh process unit group G7 where the thickness of the film is measured, and it is then transferred to the peripheral light exposure device (WEE) where the peripheral light exposure processing is performed. Note that the peripheral light exposure processing can also be performed using the peripheral light exposure device (WEE) disposed on the eighth process unit group G8 when the wafer W is transferred to the interface portion 14.

Then, the wafer W is transferred to the interface portion 14 by the first wafer transfer 62 via the high precision temperature control unit (CPL) which is disposed on the fifth process unit group G5, and the first wafer transfer 62 transfers the wafer W to the high precision temperature control (CPL) which is disposed on the ninth process unit group G9 to perform the predetermined temperature control treatment on the wafer W there. Note that there are cases in which the wafer W is temporarily transferred to the in-buffer cassette (INBR) and then transferred to the high precision temperature control unit (CPL) from there.

The wafer W having completed the temperature treatment in the high precision temperature control unit (CPL) is transferred to the in-stage 15a which is disposed on the light exposure device 15 by the second wafer transfer 63. The light exposure device 15 performs the light exposure processing on the wafer W set on the in-stage 15a and sets the wafer W on the out-stage 15b. The wafer W set on the out-stage 15b is transferred by the second wafer transfer 63 to the transit unit (TRS) disposed on the ninth process unit group G9 and is further transferred by the first wafer transfer 62 to the post-exposure bake unit (PEB) which belongs to the fifth process unit group G5 to perform the predetermined heat treatment on the wafer W there. Note that it is also acceptable to temporarily transfer the wafer W which has completed the light exposure processing to the out-buffer cassette (OUTBR) from the transit unit (TRS) then transfer it to the post-exposure bake unit (PEB) from there.

The wafer W that has completed treatment in the post-exposure bake unit (PEB) is transferred by the third main wafer transfer device 17 to the high precision temperature control unit (CPL) which belongs to the fifth process unit group G5 where the predetermined temperature treatment is performed. Next, the wafer W is transferred by the third main wafer transfer device 17 to the developing unit (DEV) which belongs to the second process unit group G2 where the developing processing is performed. The wafer W, having completed the developing processing, is transferred by the third main wafer transfer device 17 to the post-bake unit (POST) where the predetermined heat treatment is performed.

The wafer W that has completed heat treatment in the post-bake unit (POST) is transferred by the second main wafer transfer device 16 to the high precision temperature control unit (CPL) which belongs to the third process unit group G3 and after heat control, it is transferred to the transit unit (TRS-G3) and transferred from there to the inspection station 12 by the first main wafer transfer device 31. In the inspection station 12, the predetermined inspections/measurements are performed on the wafer W. The inspection/measuring processes are described in detail below.

The wafer W having completed the predetermined inspection/measurement in the inspection station 12 or the wafer W that have not been inspected/measured, as is described below, are placed on the transit unit (TRS-I) and stored in a predetermined position in the wafer cassette (CR) placed on the cassette station 11 by the wafer transfer mechanism 21.

Figure 5:
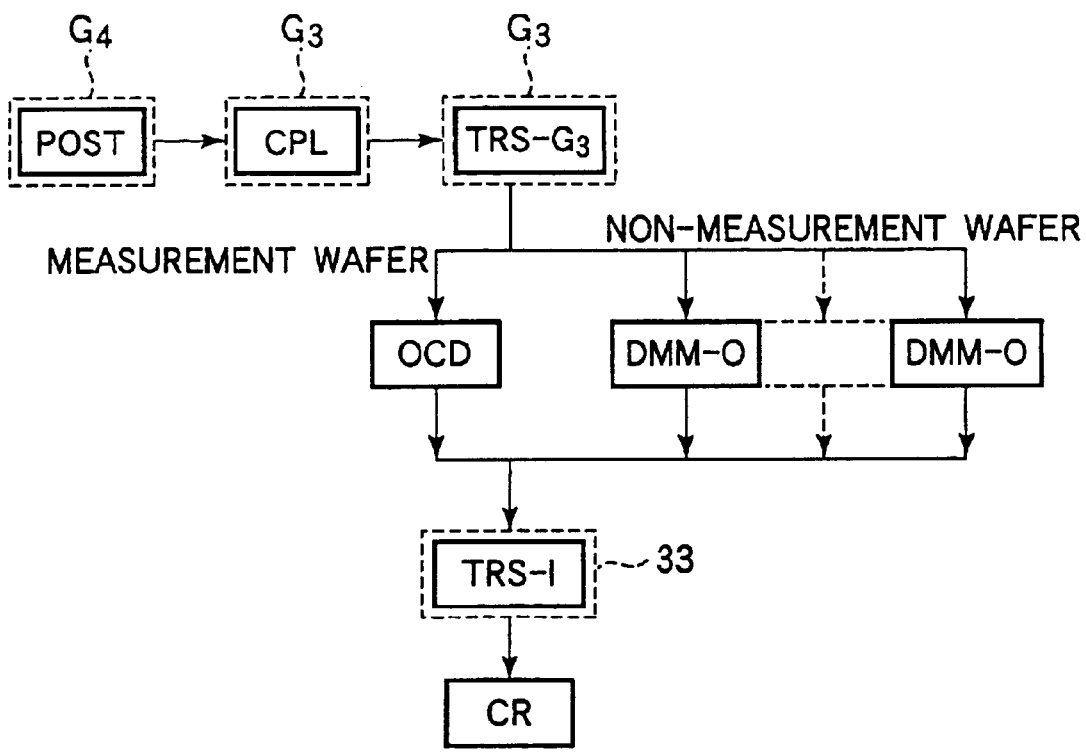
FIG. 5 is an explanatory drawing to show an example of the transfer flow of wafers in an inspection station when performing inspections using a line width measuring unit.

The following describes in detail the inspection/measurement processes that are performed in the inspection station 12. The transfer flows shown in FIG. 5 and FIGS. 6A to 6E show an example of a transfer flow when performing the measurement using the line width measuring unit (OCD) and when not inspecting the wafer W using the defect inspection unit (ADI). This transfer flow is used when the line width measuring unit (OCD) normally operating. Note that FIG. 5 shows a simplified transfer flow from the post-bake unit (POST) which belongs to the fourth process unit group G4, up to the wafer cassette (CR). Also, FIG. 6A to FIG. 6E show the changes of position of the first wafer W1 to the eighth wafer W8 over time and simply show the four dummy measurement units (DMM-O), one bypass measurement unit (BMM-O) and the transit unit (TRS-I) as the units mounted on the wafer stage module 33.

Here, when measuring using the line width measuring unit (OCD), the throughput of the inspection station 12 is assumed to be 40 substrates per hour, and the throughput excluding the inspection station 12 is assumed to be 150 substrates per hour. In such case, to enable a throughput of 150 substrates per hour on the entire resist coating/developing system 1, measurements using the line width measuring unit (OCD) must be to draw out one wafer W out of every four wafer W as the measurement wafer W.

Figure 6A:
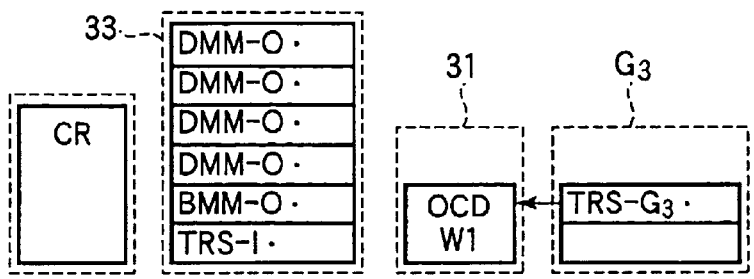
FIG. 6A to FIG. 6E are explanatory drawings to show the wafer position in the transfer flow shown in FIG. 5.

In this case, the first wafer W1 processed at the post-bake unit (POST) and then processed at the high precision temperature control unit (CPL) is transferred to the transit unit (TRS-G3) and later transferred into the line width measuring unit (OCD) by the first main wafer transfer device 31 to begin the predetermined measurements (FIG. 6A). In other words, the first wafer W1 is the measurement wafer W.

Figure 6B:
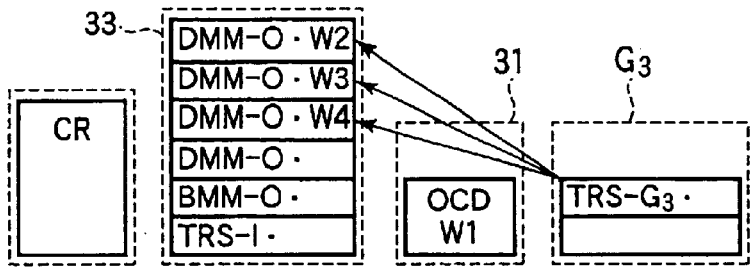

Continuing on, the second wafer W2 transferred to the transit unit (TRS-G3) is transferred to the first dummy measurement unit (DMM-O) from the top and the third wafer W3 transferred to the transit unit (TRS-G3) is transferred to the second dummy measurement unit (DMM-O) from the top, the fourth wafer W4 transferred to the transit unit (TRS-G3) is transferred to the third dummy measurement unit (DMM-O) from the top (FIG. 6B). These second wafer W2 to the fourth wafer W4 are the non-measurement wafers W.

Figure 6C:
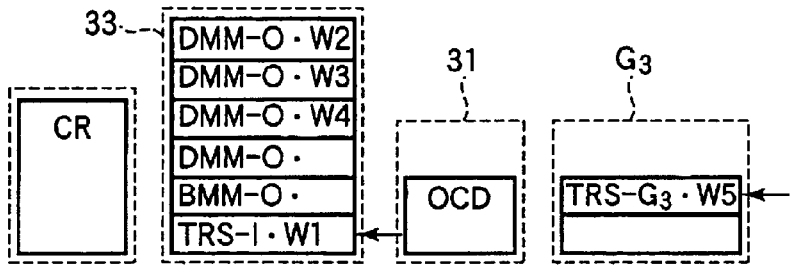

After the fourth wafer W4 is transferred to the third dummy measurement unit (DMM-O) from the top and before the fifth wafer W5 is transferred to the transit unit (TRS-G3), the measurements on the first wafer W1 are completed. Then, the first wafer W1 is transferred from the line width measuring unit (OCD) to the transit unit (TRS-I) (FIG. 6C). The first wafer W1 is stored in the predetermined position in the wafer cassette (CR) by the wafer transfer mechanism 21 under the predetermined timing.

Figure 6D:
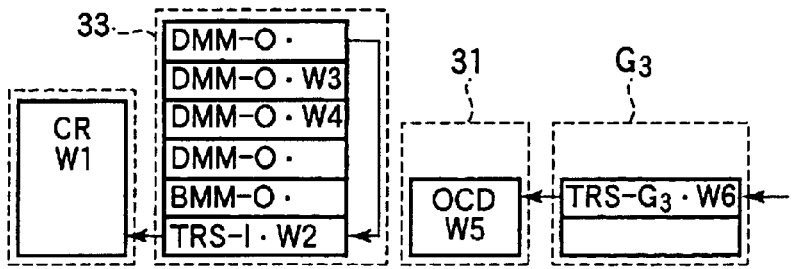
Figure 6E:
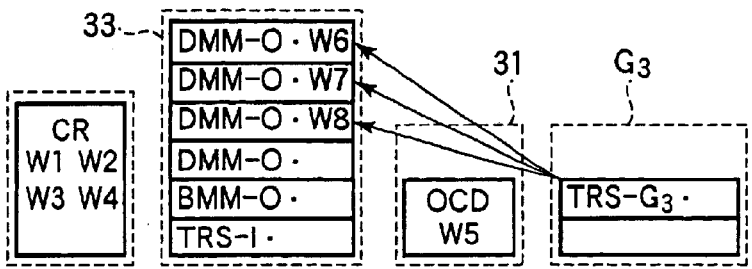

This enables the fifth wafer W5 that has been transferred to the transit unit (TRS-G3) to be transferred directly into the line width measuring unit (OCD) to undergo the predetermined measurements. Also, after the first wafer W1 is transferred out of the transit unit (TRS-I) by the wafer transfer mechanism 21, the second wafer W2 can be transferred in to the transit unit (TRS-I) (FIG. 6D). The second wafer W2 is stored in the predetermined position in the wafer cassette (CR) from the transit unit (TRS-I) by the wafer transfer mechanism 21.

This enables the sixth wafer W6 transferred to the transit unit (TRS-G3) to be transferred to the first dummy measurement unit (DMM-O) from the top in the same way as was performed for the second wafer W2. Also, when the second wafer W2 is transferred out of the transit unit (TRS-I), the third wafer W3 is transferred in to the transit unit (TRS-I). The third wafer W4 is stored in the predetermined position in the wafer cassette (CR) by the wafer transfer mechanism 21. This enables the seventh wafer W7 to be transferred to the second dummy measurement unit (DMM-O) from the top in the same way as was performed for the third wafer W3.

When the third wafer W3 is transferred out of the transit unit (TRS-I), the fourth wafer W4 is transferred in to the transit unit (TRS-I). This enables the eighth wafer W8 to be transferred to the third dummy measurement unit (DMM-O) from the top in the same way as was performed for the fourth wafer W4 (FIG. 6F). Regarding the wafers W beyond the ninth wafer W9, they can be processed in the same manner as was performed for every four wafers W from the first wafer W1 to the fourth wafer W4.

On the resist coating/developing system 1, measurements of developed line widths using such an line width measuring unit (OCD) can detect defective processing in substantially real time. When defects are confirmed through this, it is possible to take measures to stop the resist coating/developing system 1 and to inspect, or to reset the processing conditions in each of the units mounted thereupon. This effectively prevents the generation of defective wafers. Also, troublesome programming is unnecessary and it is possible to return the wafer W to and in the order in which they were transferred out of the wafer cassette (CR).

The following describes the transfer flow in the event that a failure occurs in the line width measuring unit (OCD) and the predetermined measurement cannot be performed. When a failure occurs in the line width measuring unit (OCD), a warning is issued from the warning device. The operator of the resist coating/developing system 1 can select whether to cancel the processing of the wafer W in the resist coating/developing system 1 or to skip measurements using the line width measuring unit (OCD) and to continue processing the wafer W, when canceling the warning. When canceling the processing on the wafer W, the cause of the error can be predetermined and repaired and steps can be taken to recover the wafer W being processed.

When skipping measurement using the line width measuring unit (OCD) and continuing processing on the wafer W, it is possible to use one of tree transfer methods of wafers described below.

Figure 7:
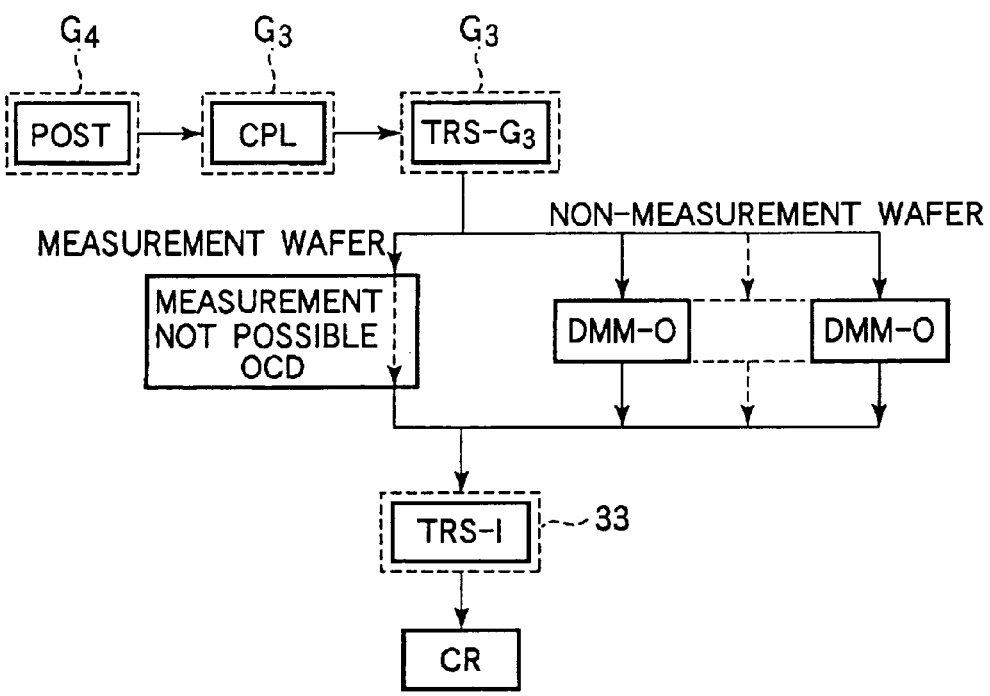
FIG. 7 is an explanatory drawing to schematically show the first transfer flow of wafers when measurement is not possible using the line width measuring unit.

FIG. 7 shows the first wafer transfer method when measuring using the line width measuring unit (OCD) is not possible. FIG. 7 shows the transfer flow when it is not possible to measure using the line width measuring unit (OCD), but it is possible to use the line width measuring unit (OCD) as a unit to place the wafer W. This transfer flow can be employed in the case where, for example, the stage that holds the wafer W is fixed and the line width measuring unit (OCD) that performs the predetermined measurements by moving a CCD camera is mounted to the inspection module 32 and the CCD camera is experiencing a failure.

The first wafer transfer flow is the same as the transfer flow shown in FIG. 6 above. Specifically, the measurement wafer W is transferred once to the line width measuring unit (OCD), but without the predetermined measurements being performed there, under the predetermined timing (for example, after the time required for measurement has passed), it is transferred to the transit unit (TRS-I) from the line width measuring unit (OCD) and then transferred from there to the wafer cassette (CR). Also, with regard to the non-measurement wafer W, they are transferred sequentially to the dummy measurement unit (DMM-O) and later are stored in determined positions in the predetermined wafer cassette (CR) via the transit unit (TRS-I).

By using the line width measuring unit (OCD) which has experienced a failure in the same way as the dummy measurement unit (DMM-O), it is possible to prevent canceling the processing of wafer W. Also, troublesome programming is unnecessary and it is possible to return the wafer W to and in the order in which they were transferred out of the wafer cassette (CR).

Figure 8:
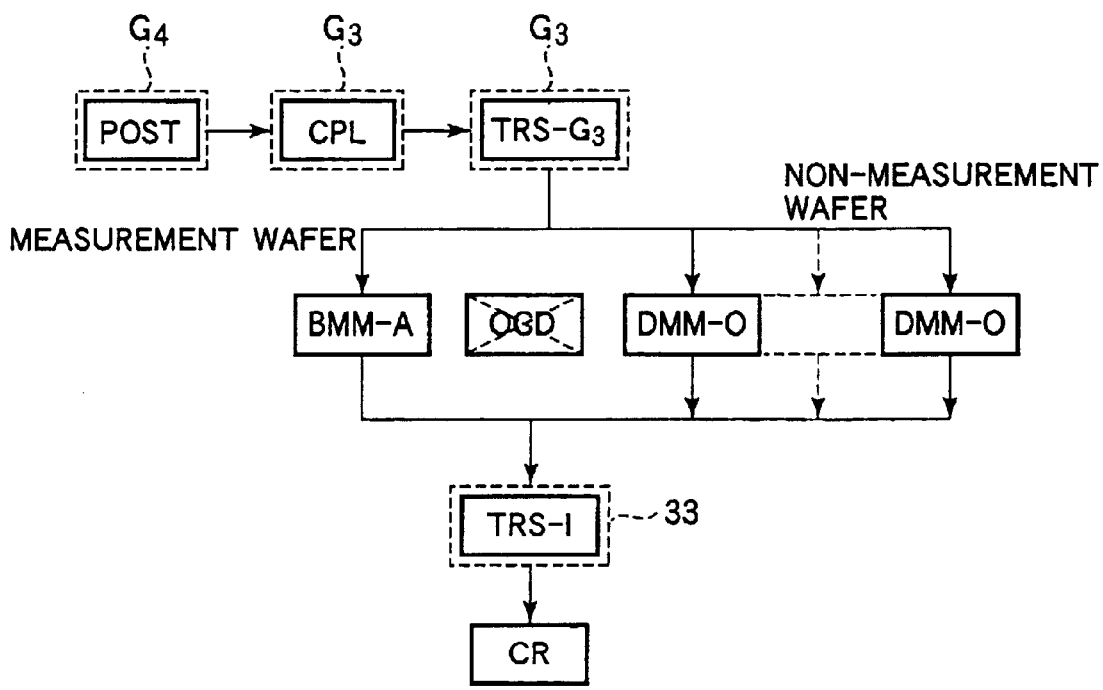
FIG. 8 is an explanatory drawing to schematically show the second transfer flow of wafers when measurement is not possible using the line width measuring unit.
Figure 9A:
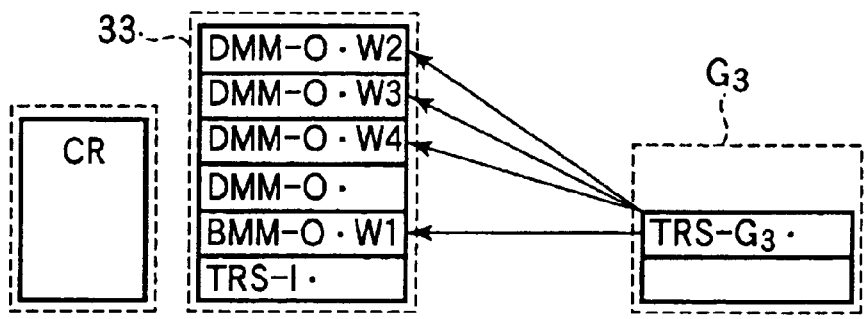
FIG. 9A to FIG. 9C are explanatory drawings to schematically show the second transfer flow when measurement is not possible using the line width measuring unit.
Figure 9B:
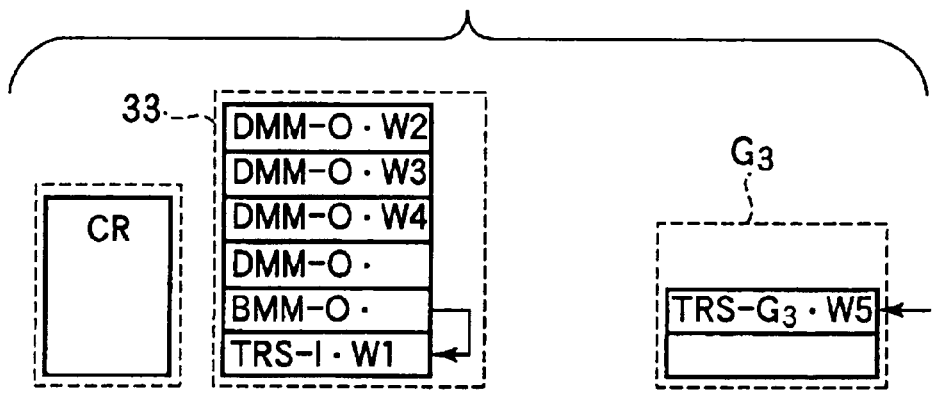
Figure 9C:
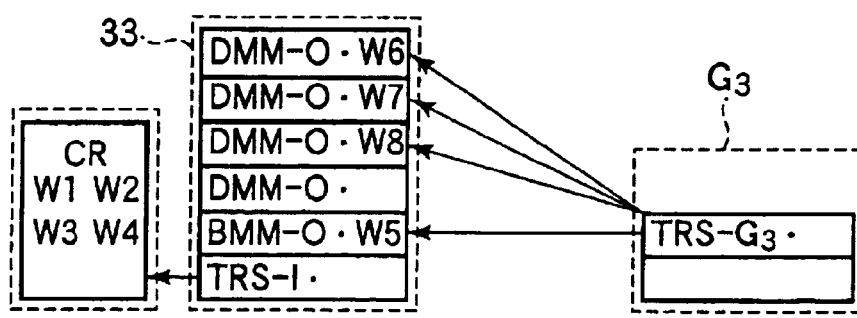

FIG. 8 is an explanatory drawing to schematically show the second transfer method of wafers when inspection is not possible using the line width measuring unit (OCD), and the FIGS. 9A to 9C are explanatory drawings to show the change of position of the first wafer W1 to eighth wafer W8 over time. FIG. 8 and FIG. 9 show the transfer flow when the wafer W cannot be placed in the line width measuring unit (OCD). This transfer flow can be employed, for example, when the line width measuring unit (OCD) that uses a rotating stage as the stage to place the wafer W is mounted on the inspection module 32 and cannot move because of a failure in the rotating stage.

In the second wafer transfer method, the first wafer W1, which is the measurement wafer W, is transferred to the bypass measurement unit (BMM-O) instead of the line width measuring unit (OCD), and the second wafer W2 to the fourth wafer W4, which are the non-measurement wafers, are sequentially transferred to the dummy measurement unit (DMM-O) (FIG. 9A). The first wafer W1 is transferred out to the transit unit (TRS-I), under a predetermined timing, for example, after the approximate amount of time has passed necessary for the determined measurement when transferred into the line width measuring unit (OCD) (FIG. 9B).

The fifth wafer W5, which is the measurement wafer, is transferred to the bypass measurement unit (BMM-O), which is empty, from the transit unit (TRS-G3) and the second wafer W2 to the fourth wafer W4 are sequentially transferred to the wafer cassette (CR) via the transit unit (TRS-I). Also, in the timing for transfer of the second wafer W2 to the fourth wafer W4, the sixth wafer W6 to the eighth wafer W8, which is the non-measurement wafer W, are sequentially transferred to the dummy measurement unit (DMM-O) (FIG. 9C). In this way, the fifth wafer W5 to the eighth wafer W8 transferred into the inspection station 12 are stored in their predetermined positions in their predetermined wafer cassette (CR) via the transit unit (TRS-I) in the same way as was performed for the first wafer W1 to the fourth wafer W4. Regarding the wafers W beyond the ninth wafer W9, they are processed in the same manner as was performed for every four wafers W from the first wafer W1 to the fourth wafer W4.

To use the line width measuring unit (OCD) in the same way as the dummy measurement unit (DMM-O) when a failure has occurred in the line width measuring unit (OCD), it is necessary to check in advance whether or not the wafer W can be placed in the line width measuring unit (OCD). However, if using the bypass measurement unit (BMM-O), it is possible to transfer the wafer W securely into the bypass measurement unit (BMM-O), so it is not necessary to check. This enables the smooth transfer of the wafer W after a failure occurs in the line width measuring unit (OCD).

Figure 10A:
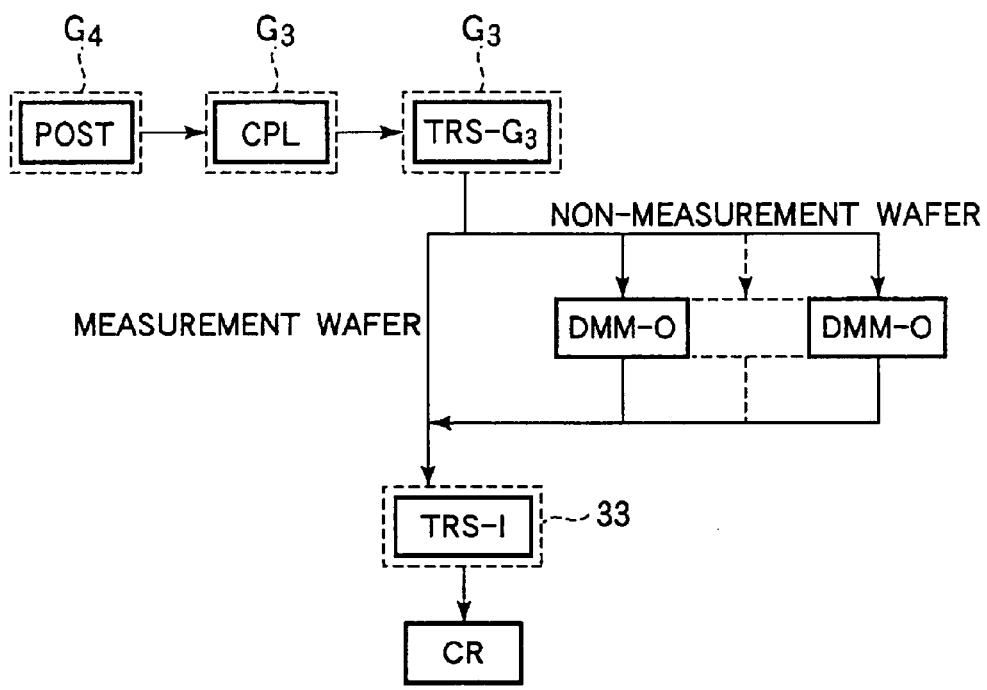
FIG. 10A is an explanatory drawing to schematically show the third transfer flow of wafers when measurement is not possible using the line width measuring unit.
Figure 10B:
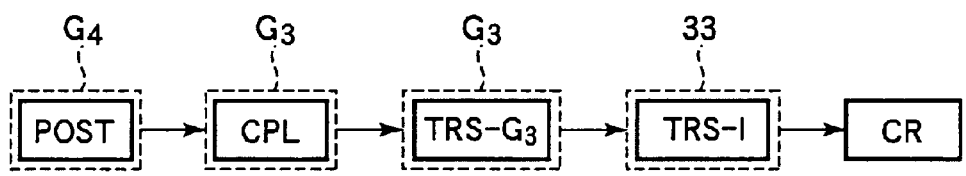
FIG. 10B is an explanatory drawing to schematically show the fourth transfer flow of wafers when measurement is not possible using the line width measuring unit.

The FIGS. 10A and 10B show the third wafer transfer method of wafers when measuring using the line width measuring unit (OCD) is not possible and another transfer flow when it is not possible to place the wafer W in the line width measuring unit (OCD). With this transfer flow, the measurement wafer W is transferred directly from the transit unit (TRS-G3) to the transit unit (TRS-I) without using the line width measuring unit (OCD) and the bypass measurement unit (BMM-O), to store them in the wafer cassette (CR).

On the one hand, as the transfer method for the non-measurement wafer W, as shown in FIG. 10A, they are transferred sequentially to the dummy measurement unit (DMM-O) and then transferred to the transit unit (TRS-I) and transferred to the wafer cassette (CR). In that case, before transferring the measurement wafer W from the transit unit (TRS-G3) to the transit unit (TRS-I), it is necessary to transfer out all of the non-measurement wafer W that have been transferred into the dummy measurement unit (DMM-O) prior to those measurement wafer W, from the inspection station 12 to the cassette station 11.

FIG. 10B shows the transfer method to transfer the non-measurement wafer W sequentially from the transit unit (TRS-G3) to the transit unit (TRS-I) and further on to the wafer cassette (CR) in the same manner as that was used for the measurement wafer W. In this case, the wafer W transferred into the transit unit (TRS-I) must be transferred out from the transit unit (TRS-I) by the wafer transfer mechanism 21 before transferring in the next wafer W.

It can go without saying that the transfer flow used when measuring using the line width measuring unit (OCD), described above, and when not inspecting the wafer W using the defect inspection unit (ADI), can be applied as it is to the transfer flow when inspecting using the defect inspection unit (ADI), but not performing measurements using the line width measuring unit (OCD). The number of dummy inspection units (DMM-A) required is determined by the inspection throughput using the defect inspection unit (ADI).

The following describes an example of transfer flow for inspecting/measuring using the defect inspection unit (ADI) and the line width measuring unit (OCD). The following describes in the case where inspections using the defect inspection unit (ADI) are performed at every two wafers and measurements using the line width measuring unit (OCD) are performed at every four wafers.

Figure 11:
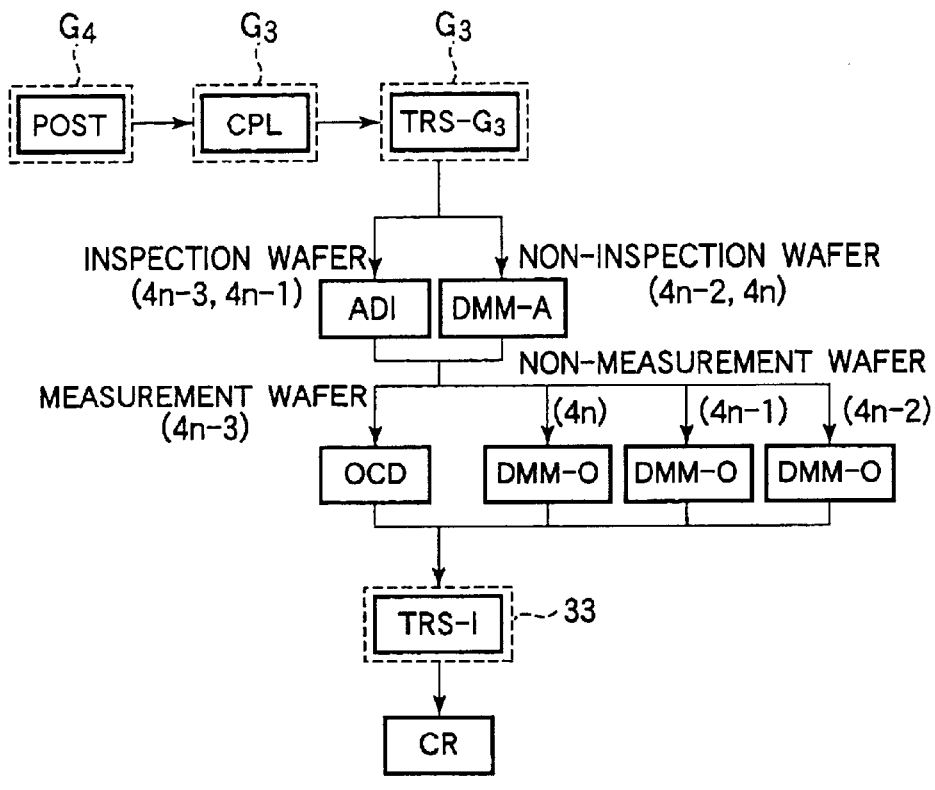
FIG. 11 is an explanatory drawing to show another example of the transfer flow of wafers in the inspection station.

FIG. 11 shows a simplified transfer flow of wafers from the post-bake unit (POST) which belongs to the fourth process unit group G4, up to the wafer cassette (CR). The transfer flow when performing inspections/transfers using the defect inspection unit (ADI) and the line width measuring unit (OCD) is the transfer flow that is series with the transfer flow that performs inspections using the defect inspection unit (ADI) and the transfer flow that performs measurements using the line width measuring unit (OCD).

Namely, the processing of the post-bake unit (POST) and the subsequent processing of the high precision temperature control unit (CPL) are completed and the odd numbered wafers W ((4n-3)th wafer and (4n-1)th wafer; n being a natural number), which are the inspection wafers W, transferred to the transit unit (TRS-G3) are transferred to the defect inspection unit (ADI) and undergo the predetermined inspection. The even numbered wafers W ((4n-2)th wafer and 4nth wafer), which are the non-inspection wafers W, transferred to the transit unit (TRS-G3) are transferred to the dummy inspection unit (DMM-A) because inspections are not being performed using the defect inspection unit (ADI).

The (4n-3)th wafer W is transferred to the line width measuring unit (OCD) as the measurement wafer for the predetermined measurement after inspecting using the defect inspection unit (ADI). Also, the (4n-2)th wafer W is transferred to the first dummy measurement unit (DMM-O) from the top as the non-measurement wafer W, from the dummy inspection unit (DMM-A). The (4n-1)th wafer W is transferred to the second dummy measurement unit (DMM-O) from the top as the non-measurement wafer W from the defect inspection unit (ADI), and the 4nth wafer W is transferred to the third dummy measurement unit (DMM-O) from the top from the dummy inspection unit (DMM-A) as the non-measurement wafer W. Later, these wafer W are transferred to the transit unit (TRS-I) in the order of (4n-3) th, (4n-2)th, (4n-1)th and 4nth and then are transferred from there to be stored in their predetermined positions in the wafer cassette (CR).

The following describes the transfer flow when a failure occurs in either or both of the defect inspection unit (ADI) and the line width measuring unit (OCD) and the inspection and/or measurement cannot be performed on the wafer W, and wafer W processing in the resist coating/developing system 1 is continued.

Figure 12:
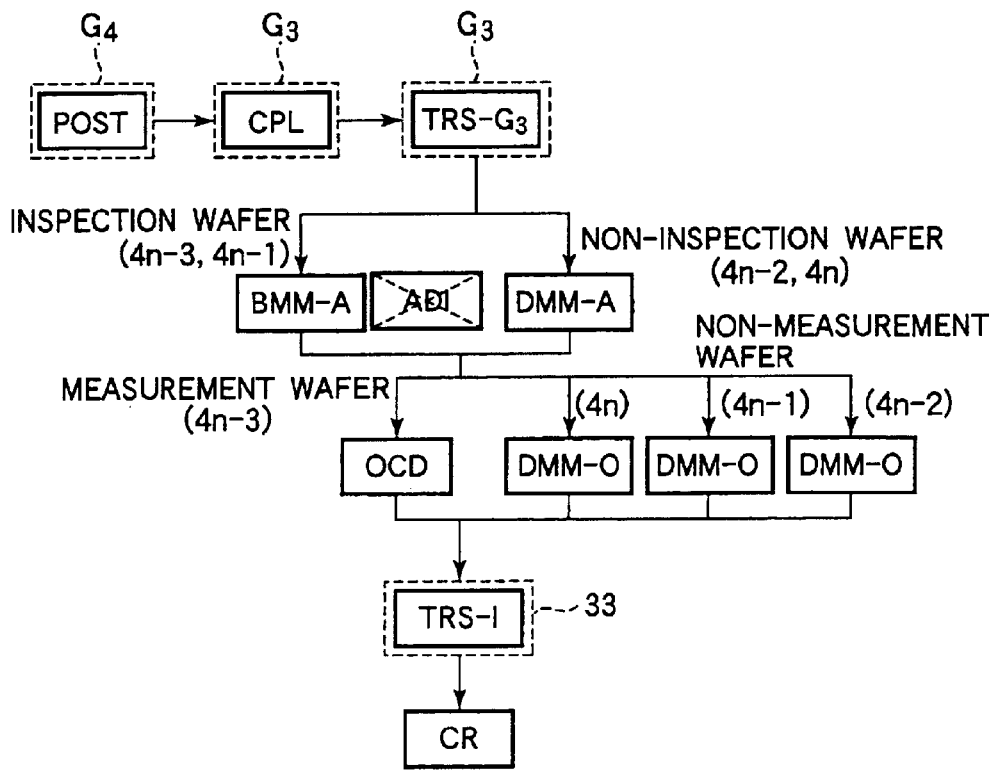
FIG. 12 is an explanatory drawing to show an example of the transfer flow of wafers when a failure occurs only in the defect inspection unit.
Figure 13:
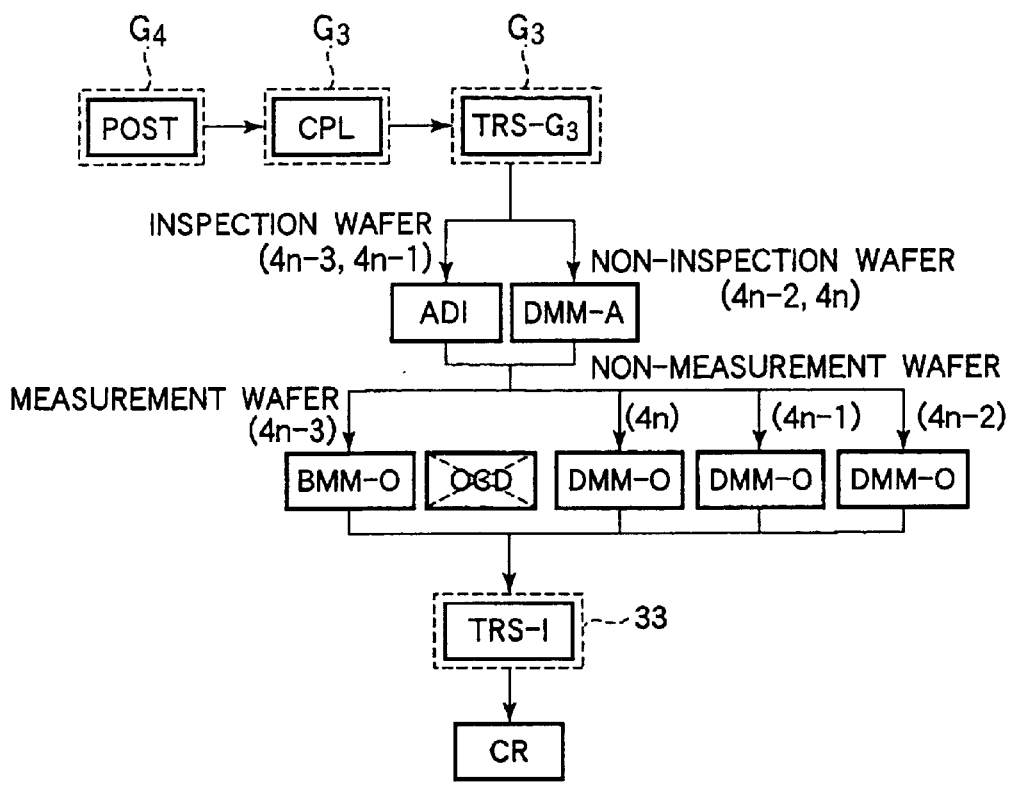
FIG. 13 is an explanatory drawing to show an example of the transfer flow of wafers when a failure occurs only in the line width measuring unit.
Figure 14:
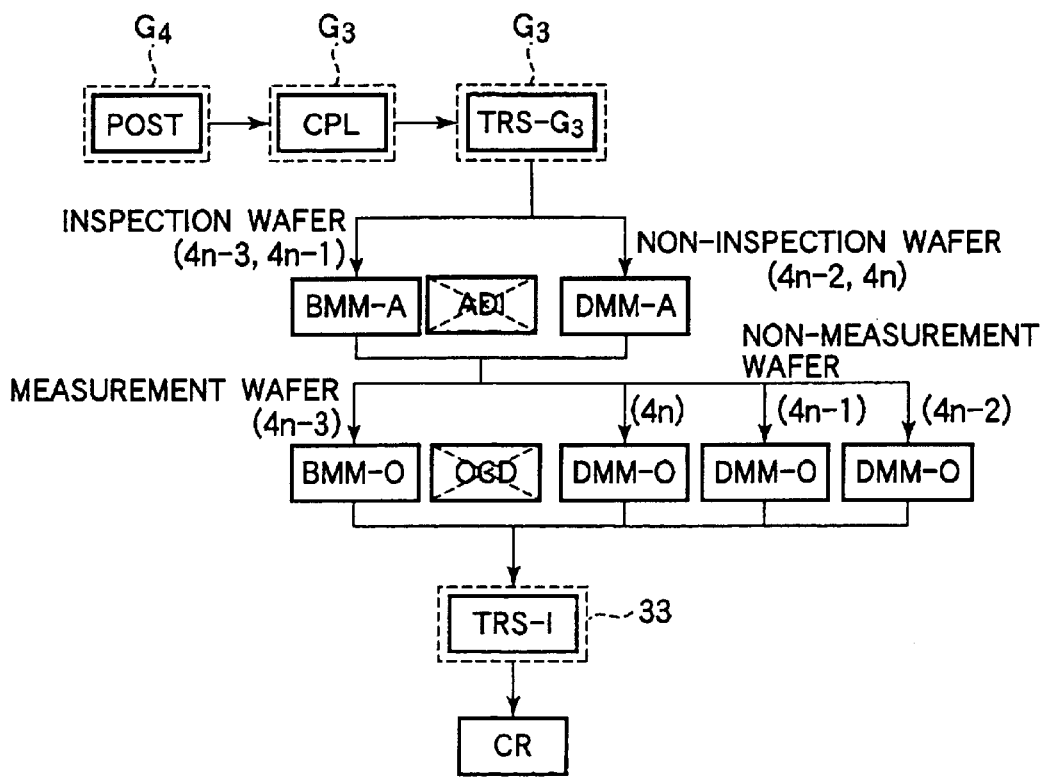
FIG. 14 is an explanatory drawing to show an example of the transfer flow of wafers when a failure occurs in both the line width measuring unit and the defect inspection unit.

FIG. 12 shows an example of a transfer flow when a failure occurs on only the defect inspection unit (ADI). FIG. 13 shows an example of a transfer flow when a failure occurs on only the line width measuring unit (OCD). FIG. 14 shows an example of a transfer flow when a failure occurs on both the defect inspection unit (ADI) and the line width measuring unit (OCD).

As shown in FIG. 12, when the defect inspection unit (ADI) cannot be used, the odd-numbered inspection wafer W is transferred to the bypass inspection unit (BMM-A) of the defect inspection unit (ADI) and the even-numbered non-inspection wafer W is transferred to the dummy inspection unit (DMM-A). Also, the transfer flows of wafers W into the line width measuring unit (OCD) and dummy measurement unit (DMM-O) are the same as that shown in FIG. 11.

The same method as the transfer flow shown in FIG. 8 above is used in the transfer flow on the defect inspection unit (ADI) side shown in FIG. 12. Instead of that, the same method as the transfer flow shown in FIG. 7 above can also be used in the transfer flow on the defect inspection unit (ADI) side. In other words, this can be used when it is possible to use the defect inspection unit (ADI) simply as a unit to hold the wafer W.

As shown in FIG. 13, if the line width measuring unit (OCD) cannot be used, the (4n-3)th measurement wafer W is transferred to the bypass measurement unit (BMM-O) and the (4n-2)th, (4n-1)the and 4nth non-measurement wafers W are sequentially transferred to the dummy measurement unit (DMM-O). At this time, it is possible to use the same transfer flow as that shown in FIG. 11 for the transfer flow using the defect inspection unit (ADI). The same method as the transfer flow shown in FIG. 8 above is used in the transfer flow on the line width measuring unit (OCD) side shown in FIG. 13. Instead of that, the same method as the transfer flow shown in FIG. 7 above or FIG. 10 can also be used in the transfer flow.

The transfer flow on the defect inspection unit (ADI) side shown in FIG. 14 is the same as that for the defect inspection unit (ADI) side shown in FIG. 12. The transfer flow on the line width measuring unit (OCD) side shown in FIG. 14 is the same as that for the line width measuring unit (OCD) side shown in FIG. 13. The same transfer flow as that shown in FIG. 7 can be applied to the transfer flow on the defect inspection unit (ADI) side. The same method as the transfer flow shown in FIG. 7 or FIG. 10 can also be used in the transfer flow on the line width measuring unit (OCD) side. Also, it is possible to process the wafers W using combinations of these various transfer flows.

As described above, in the event that inspections/measurements are not possible using the defect inspection unit (ADI) or the line width measuring unit (OCD), and the processing of the wafers W in the resist coating/developing system 1 is continued, after storing all of the wafer W in the wafer cassette (CR), for example, a predetermined wafer W can pulled out and undergo the predetermined inspection/measurement using the inspecting/measuring devices separately comprised in the resist coating/developing system 1.

The above describes the embodiment of the present invention, but this invention is by no means limited to the embodiment so described. Although the above description explains when the inspection station 12 is established between the cassette station 11 and the process station 13, it is possible for the cassette station 11 and the process station 13 to be directly linked, for example, disposing the inspection module equipped with the line width measuring unit (OCD), a plurality of dummy measurement unit (DMM-o) and the bypass measurement unit (BMM-O) on the front side or the back side of the resist coating/developing process system 1 that can be accessed by the wafer transfer mechanism 21 established on the cassette station 11. In this case, it is simple to maintain the transfer ordering of the wafer W when a failure occurs on the line width measuring unit (OCD).

Also, according to the description provided above, the bypass measurement unit (BMM-O) and bypass inspection unit (BMM-A) are disposed on each of the line width measuring units (OCD) and defect inspection units (ADI), but it is also perfectly acceptable to dispose one bypass inspecting/measuring unit (BMM) for the line width measuring unit (OCD) and the defect inspection unit (ADI). In this case, when one of the line width measuring unit (OCD) or the defect inspection unit (ADI) experience a failure, the one bypass inspecting/measuring unit (BMM) can be used instead of the failed unit.

The methods to select and to inspect/measure the wafer W and the methods to transfer the wafers W, described above, can also be applied when the throughput in the inspection station 12 is higher than that of other stations.

Further, the inspecting/measuring of the wafer W in the inspection station 12 is not limited to inspections/measurements using the defect inspection unit (ADI) or the line width measuring unit (OCD). For example, in the inspection station 12, it is also possible to combine a film thickness inspection device (FTI), a defocus inspection device for inspecting misalignment of patterns that are generated in the light exposure processing, a particle inspection device for detecting dust particle counts attaching to the wafer, a splash pack detection device for detecting whether or not resist solution solvent splashed from the surface of the wafer has re-attached to the wafer again, a common defect inspection unit for detecting common defects that appear in the same positions and in the same shapes on the surface of the wafer, a scum detection device for detecting residual resist that remains on the wafer after development, a clamp ring detection device or a non-resist inspection device or a non-develop inspection device.

When these various inspecting/measuring devices are mounted to the inspection station 12, it is acceptable to dispose the dummy inspection/measurement units (DMM) and the bypass inspection/measurement units (BMM) required for each inspecting/measuring device or for each of a plurality of each inspecting/measuring devices. Also, the transfer flow of the wafer W can be serial to the transfer flow for each inspection/measuring device, in the same way as the transfer flow shown in FIG. 11.

The above description applies to semiconductor wafers as substrates to be processed, but the substrate can also be glass substrates used in liquid crystal display devices (LCD) or substrates for reticle used for photo mask. Also, that above has described a resist coating/developing for the processing of substrates, but this invention can be applied to substrate processing apparatuses in which a cleaning processing, a coating processing of an interlayer insulating film, or an etching processing, etc. are performed. In that case, the inspecting/measuring device that corresponds to the substrate processing is disposed on the inspection station.

The embodiments described above are simply intended to clarify the technical concept of the present invention. Of course, the present invention should not be limited to the embodiments described-above in interpreting the technical scope of the present invention. The present invention can be worked in variously modified fashions within the spirit of the present invention and within the scope defined by the accompanying claims.

What is claimed is:

1. A substrate processing apparatus that performs predetermined process on a series of substrates one by one comprising:

a cassette station that holds cassettes storing a plurality of substrates;

a process station for performing predetermined process on a substrate transported out from said cassettes;

an inspection station for performing predetermined inspection and/or measurement on a substrate that have completed said process at said process station;

a substrate transfer means for transferring a substrate between said cassette station, said process station and said inspection station; and a transfer control mechanism for controlling the operations of said substrate transfer means;

wherein said inspection station comprises:

an inspecting/measuring unit for performing the inspection and/or measurement on a substrate transferred from said process station to said inspection station; and an emergency stage unit into which a inspection/measurement substrate for the inspection and/or measurement using said inspecting/measuring unit is temporarily transferred, said emergency stage unit being established in parallel to said inspecting/measuring unit;

and wherein said transfer control mechanism controls said substrate transfer means to transfer said inspection/measurement substrate from said process station to said cassette station via said substrate stage when circumstances disallow transferring substrates into said inspecting/measuring unit.

2. A substrate processing apparatus that performs predetermined process on a series of substrates one by one comprising:

a cassette station having a cassette stage for holding a cassette that stores a plurality of substrates and a substrate transfer I/O device for transferring a substrate into and out of said cassette placed on said cassette stage;

a process station for performing predetermined process on a substrate transferred out from said cassette;

an inspection station having an inspecting/measuring unit for performing predetermined inspection and/or measurement on a substrate that have completed process at said process station, said inspection station being established between said cassette station and said process station; and a selecting means for selecting inspection/measurement substrates for the inspection and/or measurement using said inspecting/measuring unit from substrates transferred into said inspection station;

wherein said process station comprises:
a process portion in which the predetermined process is performed on a substrate;
a substrate transfer device for transferring a substrate into and out of said process portion and transfers each substrate having been processed at said process portion to said inspection station in the same order as transferred from said cassette;

and wherein said inspection station further comprises:
a temporary stage unit that temporarily holds non-inspection substrates other than said inspection/measurement substrates; and
a substrate transfer means for transferring a substrate according to the order transferred from said cassette, from said cassette station to said process station and transferring a substrate from said inspection station to said cassette station according to the order transferred into said inspection station, and transferring a substrate into and out of said inspecting/measuring unit and said temporary stage unit.

3. The substrate processing apparatus according to claim 2, wherein:
said inspection station is further comprises an emergency stage unit into which said inspection/measurement substrates are temporarily transferred, said inspection station being established in parallel to said inspecting/measuring unit;
and when circumstances disallow transferring said inspection/measurement substrates into said inspecting/measuring unit, said substrate transfer means transfer said inspection/measurement substrates from said process station to said cassette station via said emergency stage unit.

4. The substrate processing apparatus according to claim 2, wherein said inspection station comprises:
a plurality of inspecting/measuring units performing different inspections or measurements; and
a plurality of emergency stage units each disposed for each of said plurality of inspecting/measuring units.

5. The substrate processing apparatus according to claim 2, wherein said selecting means select one substrate every a predetermined number of substrates as said inspection/measurement substrates.

6. The substrate processing apparatus according to claim 2, wherein said inspection station comprises:
a warning device that issues warnings when circumstances disallow transferring said inspection/measurement substrates to said inspecting/measuring units; and a warning canceling device that selects to cancel transferring and processing on all substrates in said cassette station, said process station and said inspection station or to skip the inspection and/or the measurement using said inspecting/measuring unit when canceling the warning issued by said warning device.

7. The substrate processing apparatus according to claim 2,
wherein said process portion in said process station comprises:
a coating process unit for coating a substrate with resist solution;
a developing process unit for developing a light-exposed substrate; and
a heat treatment unit for performing a predetermined heat treatment on a substrate.

8. The substrate processing apparatus according to claim 2, further comprises an interface portion having another substrate transfer device to transfer a substrate between another substrate processing apparatus disposed adjacently to said process station and said process station.

9. A substrate processing method, comprising steps of:
transferring a substrate from a cassette that stores a plurality of substrates to a process station for performing predetermined process on a substrate;
processing substrates one by one in said process station that are transferred into said process station;
transferring each substrate that have completed the process in said process station from said process station to an inspection station for performing inspecting/measuring a state of processed substrate, said inspection station having an inspecting/measuring unit for performing predetermined inspection and/or measurement on a substrate;
selecting inspection/measurement substrates for the inspection and/or measurement using said inspecting/measuring unit from substrates transferred to said inspection station;
temporarily transferring said inspection/measurement substrates to a emergency stage unit that established in parallel with said inspecting and/or measuring unit when circumstances arise that disallow transferring of said inspection/measurement substrates into said inspecting/measuring unit; and
transferring each substrate transferred into said emergency stage unit to said cassette station.

10. The substrate processing method according to claim 9, wherein processes on a substrate in said process station are resist solution coating processing, development processing of a light-exposed substrate and heat treatment which is incidental to said resist solution coating processing and said development processing;
in said inspection station, defect inspections after said developing processing are performed by photographic imaging using a CCD camera.

11. A substrate processing method comprising steps of:
transferring substrates one by one to from a cassette that stores a plurality of substrates to a process station for performing predetermined process on substrates according to the order that substrates are arranged in said cassette;
processing substrates one by one in said process station that are transferred into said process station;
transferring each substrate that have completed process in said process station from said process station to an inspection station for performing inspecting/measuring a state of processed substrate in the same order as the substrates were transferred from said cassette, said inspection station having a inspecting/measuring unit for performing predetermined inspection and/or measurement on a substrate;

selecting inspection/measurement substrates for the inspection and/or measurement using said inspecting/measuring unit from substrates transferred to said inspection station;

temporarily transferring said inspection/measurement substrates to an emergency stage unit that holds a substrate and established in parallel with said inspecting/measuring unit when circumstances arise that disallow transferring of said inspection/measurement substrates into said inspecting/measuring unit, in case where each of said inspection/measurement substrates is transferred to said inspecting/measuring unit, transferring non-inspection substrates other than said inspection/measurement substrates to a temporary stage unit that holds a substrate and established in parallel with said inspecting/measuring unit, in the order of transfer to said inspection station; and transferring each substrate from said inspecting/measuring unit, said emergency stage unit and said temporary stage unit to said cassette station in the order of transfer to said inspection station.

12. The substrate processing method according to claim 11, wherein processes on a substrate in said process station are resist solution coating processing, development processing of a light-exposed substrate and heat treatment which is incidental to said resist solution coating processing and said development processing;

in said inspection station, defect inspections after said developing processing are performed by photographic imaging using a CCD camera.

13. A substrate processing method comprising steps of:

transferring substrates one by one from a cassette that stores a plurality of substrates to a process station for performing predetermined process on substrates according to the order that substrates are arranged in said cassette;

processing substrates one by one in said process station that are transferred into said process station;

transferring each substrate that have completed process in said process station from said process station to an inspection station for performing inspecting/measuring a state of processed substrate in the same order as the substrates were transferred from said cassette, said inspection station having a inspecting/measuring unit for performing predetermined inspection and/or measurement on a substrate;

selecting inspection/measurement substrates for the inspection and/or measurement using said inspecting/measuring unit from substrates transferred to said inspection station;

temporarily transferring said inspection/measurement substrates to said inspecting/measuring unit when circumstances arise that disallow the inspection and/or measurement of said inspection/measurement substrates using said inspecting/measuring unit, but transferring of said inspection/measurement substrates into said inspecting/measuring unit is permitted, in case where each of said inspection/measurement substrates is transferred to said inspecting/measuring unit;

transferring said non-inspection substrates to a temporary stage unit that holds a substrate and established in parallel with said inspecting and/or measuring unit, in the order of transfer to said inspection station;

transferring non-inspection substrates other than said inspection/measurement substrates to a temporary stage unit that holds a substrate and established in parallel with said inspecting/measuring unit, in the order of transfer to said inspection station; and transferring each substrate from said inspecting/measuring unit and said temporary stage unit to said cassette station in the order of transfer to said inspection station.

14. The substrate processing method according to claim 13, wherein processes on a substrate in said process station are resist solution coating processing, development processing of a light-exposed substrates and heat treatment which is incidental to said resist solution coating processing and said development processing;

in said inspection station, defect inspections after said developing processing are performed by photographic imaging using a CCD camera.

* * * * *